US007855507B2

(12) United States Patent
Kim

(10) Patent No.: US 7,855,507 B2
(45) Date of Patent: Dec. 21, 2010

(54) ORGANIC LIGHT EMITTING DISPLAY DEVICE AND FABRICATING METHOD OF THE SAME HAVING ORGANIC LIGHT EMITTING DIODES STACKED IN A DOUBLE LAYER

(75) Inventor: Eun-ah Kim, Suwon-si (JP)

(73) Assignee: Samsung Mobile Display Co., Ltd., Yongin (KR)

( * ) Notice: Subject to any disclaimer, the term of this patent is extended or adjusted under 35 U.S.C. 154(b) by 1004 days.

(21) Appl. No.: 11/406,802

(22) Filed: Apr. 19, 2006

(65) Prior Publication Data

US 2006/0255725 A1 Nov. 16, 2006

(30) Foreign Application Priority Data

Apr. 27, 2005 (KR) .............. 10-2005-0035215

(51) Int. Cl.
*H05B 33/00* (2006.01)
*H01J 1/62* (2006.01)
(52) U.S. Cl. .............. 313/506; 313/500; 313/504; 313/505; 257/40; 257/72; 257/88
(58) Field of Classification Search .......... 313/504, 313/506
See application file for complete search history.

(56) References Cited

U.S. PATENT DOCUMENTS 5,757,139 A * 5/1998 Forrest et al. ........... 315/169.3

| 2003/0218173 | A1* | 11/2003 | Nishi et al. ........... 257/79 |
| 2004/0113545 | A1* | 6/2004 | Pang et al. ........... 313/504 |
| 2004/0222746 | A1* | 11/2004 | Winters ........... 315/167 |
| 2004/0233140 | A1 | 11/2004 | Jo |
| 2004/0263499 | A1* | 12/2004 | Tanada et al. ........... 345/204 |
| 2005/0012465 | A1* | 1/2005 | Uchida ........... 315/169.3 |
| 2005/0062408 | A1* | 3/2005 | Yoo et al. ........... 313/504 |
| 2007/0120465 | A1* | 5/2007 | Ito et al. ........... 313/504 |

FOREIGN PATENT DOCUMENTS

CN 1246268 3/2000

(Continued)

OTHER PUBLICATIONS

First Office Action for Chinese Patent Application No. 200610077127.9 dated May 30, 2008 by Chinese Patent Office.

(Continued)

*Primary Examiner*—Sikha Roy
(74) *Attorney, Agent, or Firm*—Knobbe Martens Olson & Bear LLP

(57) ABSTRACT

An organic light emitting display device and a method of fabricating the same are disclosed. The organic light emitting display device includes a first organic light emitting diode and a second organic light emitting diode. The first organic light emitting diode has a first electrode, a second electrode, and a first organic emission layer positioned between the first and second electrodes. The second organic light emitting diode has the second electrode, a third electrode, and a second organic emission layer positioned between the second and third electrodes. A first driver thin film transistor is connected to the first electrode. A second driver thin film transistor is connected to the second electrode.

11 Claims, 9 Drawing Sheets

FOREIGN PATENT DOCUMENTS

| | | |
|---|---|---|
| CN | 100555655 C | 10/2009 |
| JP | 2004-247130 | 9/2004 |
| JP | 2004-335468 | 11/2004 |
| JP | 2005-071696 | 3/2005 |
| JP | 2005-071920 | 3/2005 |
| WO | WO 2004/051614 A1 | 6/2004 |

OTHER PUBLICATIONS

Japanese Notice of Allowance for Japanese patent application No. 2005-282374 dated Oct. 20, 2009.

* cited by examiner

ORGANIC LIGHT EMITTING DISPLAY DEVICE AND FABRICATING METHOD OF THE SAME HAVING ORGANIC LIGHT EMITTING DIODES STACKED IN A DOUBLE LAYER

CROSS-REFERENCE TO RELATED APPLICATIONS

This application claims the benefit of Korean Patent Application No. 10-2005-35215, filed Apr. 27, 2005, the contents of which are hereby incorporated herein by reference in their entirety.

BACKGROUND OF THE INVENTION

1. Field of the Invention

The present invention relates to an organic light emitting display device, and more particularly, to an organic light emitting display device that has organic light emitting diodes stacked in a double layer. The present invention also relates to a method of fabricating the organic light emitting display device.

2. Description of the Related Art

FIG. 1 is a circuit diagram of a unit pixel of a conventional organic light emitting display device. Referring to FIG. 1, a scan line S, a data line D, and a common power line ELVDD are disposed. A unit pixel is defined by an intersection of the data line D and the scan line S.

The unit pixel includes an organic light emitting diode (OLED), which has an anode, a cathode, and an organic emission layer formed between the anode and the cathode. The unit pixel also includes a switching transistor Ma, a capacitor Cst, and a driver transistor Mb. The switching transistor Ma has a gate connected to the scan line S and a source connected to the data line D. The switching transistor Ma switches a data signal applied to the data line by a scan signal applied to the scan line S. The capacitor Cst is connected between the common power line ELVDD and the drain of the switching transistor Ma, and maintains the data signal for a predetermined time. The driver thin film transistor Mb has a gate connected to the capacitor Cst, a source connected to the common power line ELVDD, and a drain connected to the anode of the OLED. The driver thin film transistor Mb supplies a current proportional to the magnitude of the data signal to the anode. A cathode voltage ELVSS, having a level lower than the power supply voltage applied to the common power line, is applied to the cathode of the OLED. As a result, holes from the anode and electrons from the cathode are injected into the organic emission layer. The injected holes and electrons are combined in the organic emission layer to create excitons, which emit light by transitioning from an excited state to a ground state.

FIGS. 2A and 2B [These figures are too dark—please send copies with better contrast] are photographs illustrating short failures between an anode and a cathode of an OLED. To detail this, FIG. 2A shows a short failure between the anode and the cathode caused by a foreign substance. FIG. 2B shows a short failure between the cathode and the anode due to the cathode being pressed by an external impact.

When a short failure occurs between the anode and the cathode due to errors in the manufacturing process, the OLED no longer emits light. Consequently, the unit pixel having the OLED where the short failure has occurred becomes a dark pixel, which lowers the yield of displays that meet commercial specifications.

SUMMARY OF CERTAIN INVENTIVE ASPECTS

The present invention provides an organic light emitting display device and a method of fabricating the organic light emitting display device, which may prevent the yield from dropping even when errors occur during the manufacturing process.

In one embodiment of the present invention, an organic light emitting display device is provided. The organic light emitting display device includes a first OLED and a second OLED. The first OLED has a first electrode, a second electrode, and a first organic emission layer positioned between the first and second electrodes. The second OLED has the second electrode, a third electrode, and a second organic emission layer positioned between the second and third electrodes. A first driver thin film transistor is connected to the first electrode. A second driver thin film transistor is connected to the second electrode. A work function assistant layer may be formed between the second electrode and the first organic emission layer.

In another embodiment of the present invention, a method of fabricating an organic light emitting display device is provided. The method includes forming a first driver thin film transistor and a second driver thin film transistor on a substrate. A first electrode connected to the first driver thin film transistor is formed. A first organic emission layer is formed on the first electrode. A second electrode connected to the second driver thin film transistor is formed on the first organic emission layer. A second organic emission layer is formed on the second electrode. A third electrode is formed on the second organic emission layer.

DETAILED DESCRIPTION OF CERTAIN INVENTIVE EMBODIMENTS

The following detailed description is directed to certain specific embodiments of the invention. However, the invention can be embodied in a multitude of different ways as defined and covered by the claims. In this description, reference is made to the drawings wherein like parts are designated with like numerals throughout. It will be understood that when a layer is referred to as being "on" another layer or substrate, it may be directly on the other layer or substrate or intervening layers may also be present.

Figure 1:
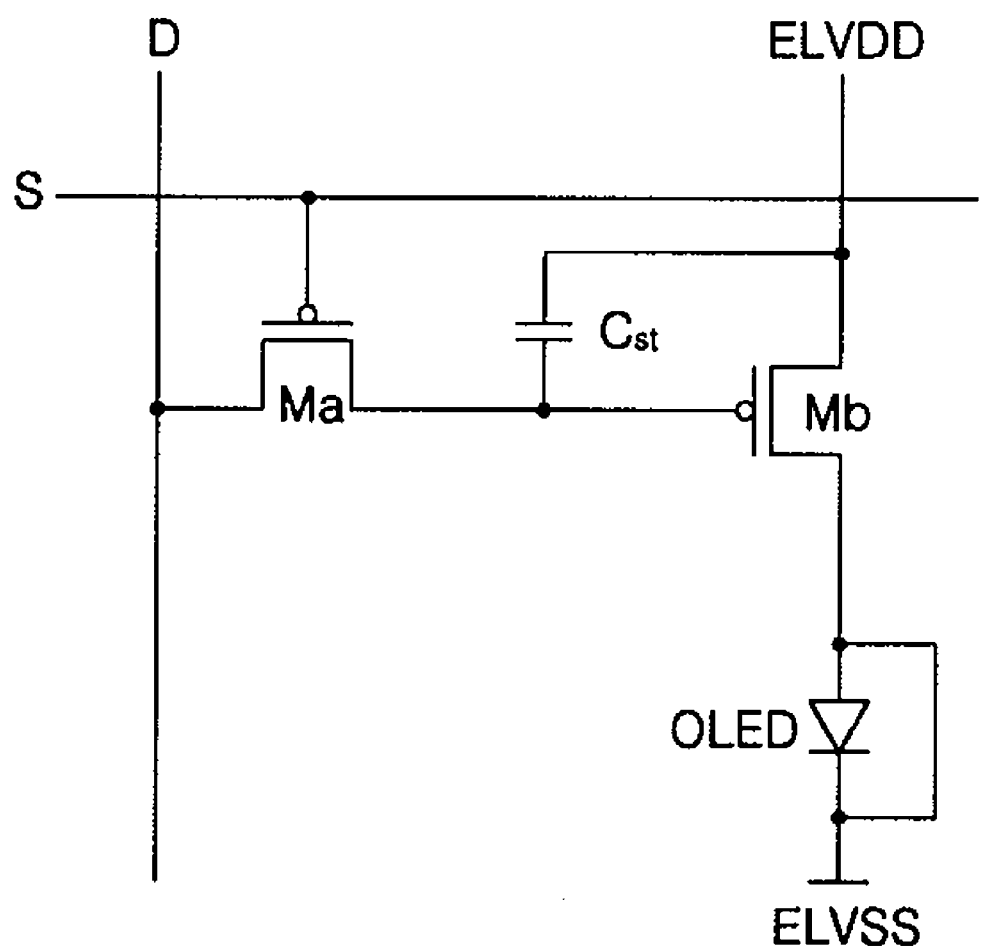
FIG. 1 is a circuit diagram of a unit pixel of a conventional organic light emitting display device.
Figure 2A:
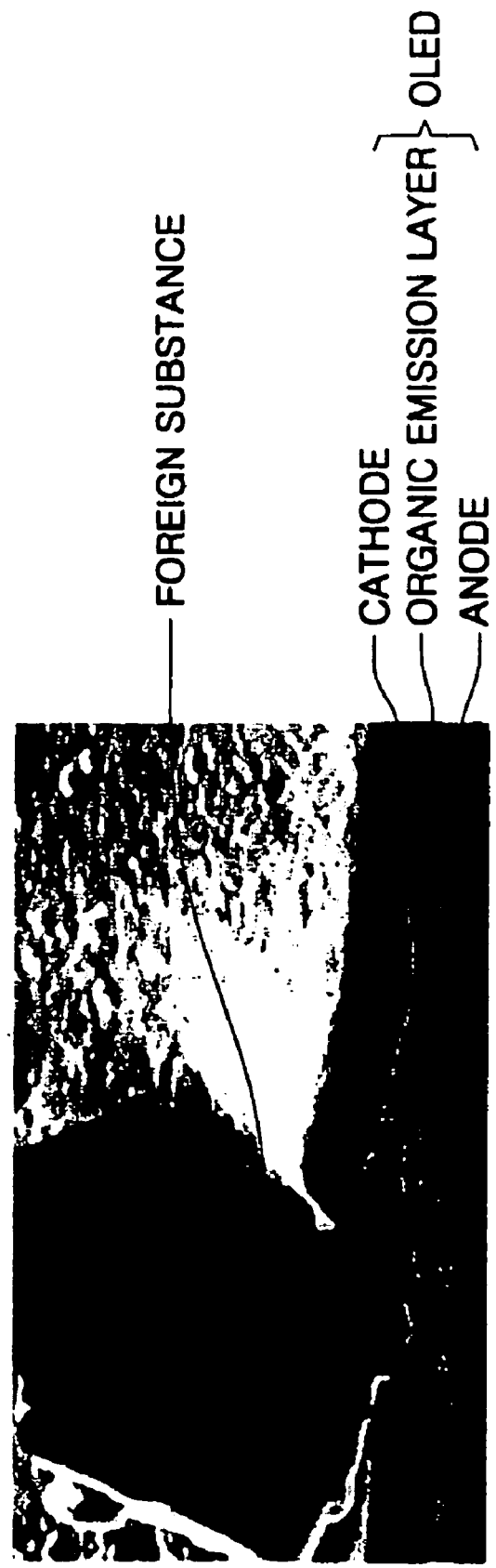
FIGS. 2A and 2B are photographs illustrating short failures occurring between an anode and a cathode of an OLED.
Figure 2B:
Figure 3:
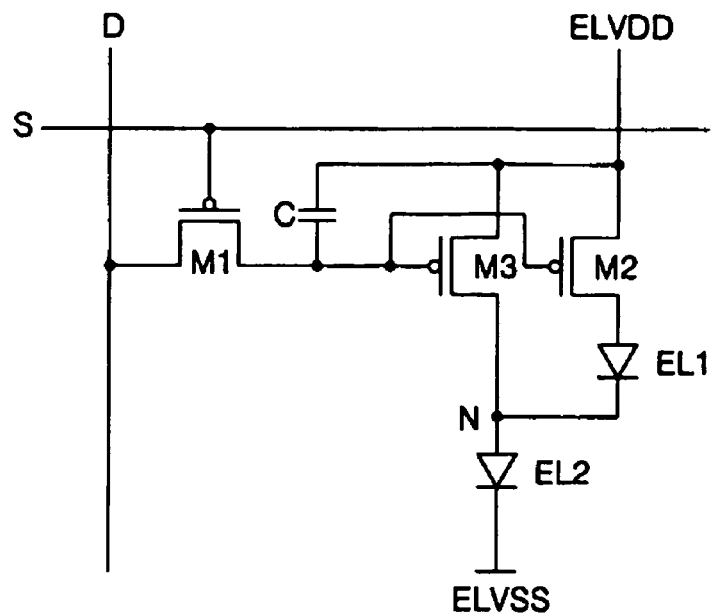
FIG. 3 is a circuit diagram of a unit pixel of an organic light emitting display device in accordance with an embodiment of the present invention.

FIG. 3 is a circuit diagram of a unit pixel of an organic light emitting display device in accordance with an embodiment of the present invention. Referring to FIG. 3, a scan line S, and a data line D crossing the scan line S, are disposed. A unit pixel is defined by the intersection of the data line D and the scan line S. The unit pixel includes a switching transistor M1, a capacitor C, a first driver transistor M2, a second driver transistor M3, a first OLED (EL1), and a second OLED (EL2).

The switching transistor M1 has a gate connected to the scan line S and a source connected to the data line D. The switching transistor M1 switches a data signal applied to the data line D by a scan signal applied to the scan line S. The capacitor C, connected between a common power line ELVDD and a drain of the switching transistor M1, maintains the data signal for a predetermined time.

The first driver thin film transistor M2 is connected by a gate to the capacitor C, by a source to the common power line ELVDD, and by a drain to one electrode of the first OLED (EL1). The second driver thin film transistor M3 is connected by a gate to the capacitor C, by a source to the common power line ELVDD, and by a drain to a node N. The first driver thin film transistor M2 supplies a current proportional to the magnitude of the data signal to the one electrode of the first OLED (EL1). The second driver thin film transistor M3 supplies a current proportional to the magnitude of the data signal to the node N. In the meantime, the other electrode of the first OLED (EL1) is connected to the node N, and that node N is connected to one electrode of the second OLED (EL2). A reference voltage is applied to the other electrode of the second OLED (EL2).

Furthermore, a gate electrode of the first driver thin film transistor M2 and a gate electrode of the second driver thin film transistor M3 are connected to each other. A source electrode of the first driver thin film transistor M2 and a source electrode of the second driver thin film transistor M3 are also connected to each other.

Hereinafter, the operation of the aforementioned pixel circuit will be described.

First, when the scan line S becomes activated, the switching transistor M1 turns on so that the data signal applied to the data line is transferred to the capacitor C. The data signal transferred to the capacitor C is stored in the capacitor C for a predetermined period.

The data signal stored in the capacitor C turns on the first driver thin film transistor M2 and the second driver thin film transistor M3. As a result, the first driver thin film transistor M2 supplies a current proportional to the magnitude of the data signal to the first OLED (EL1), and the second driver thin film transistor M3 supplies a current proportional to the magnitude of the data signal to the node N. A gate electrode of the first driver thin film transistor M2 is connected to a gate electrode of the second driver thin film transistor M3, and their source electrodes are also connected to each other. Consequently, a voltage difference applied to both ends of the first OLED (EL1) is not significant when the characteristics of the first driver thin film transistor M2 are similar to those of the second driver thin film transistor M3. Accordingly, the first OLED (EL1) may hardly emit light.

On the other hand, the second OLED (EL2) emits light by means of the current applied to the node N, or more specifically, the current applied to the one electrode of the second OLED (EL2).

Figure 5:
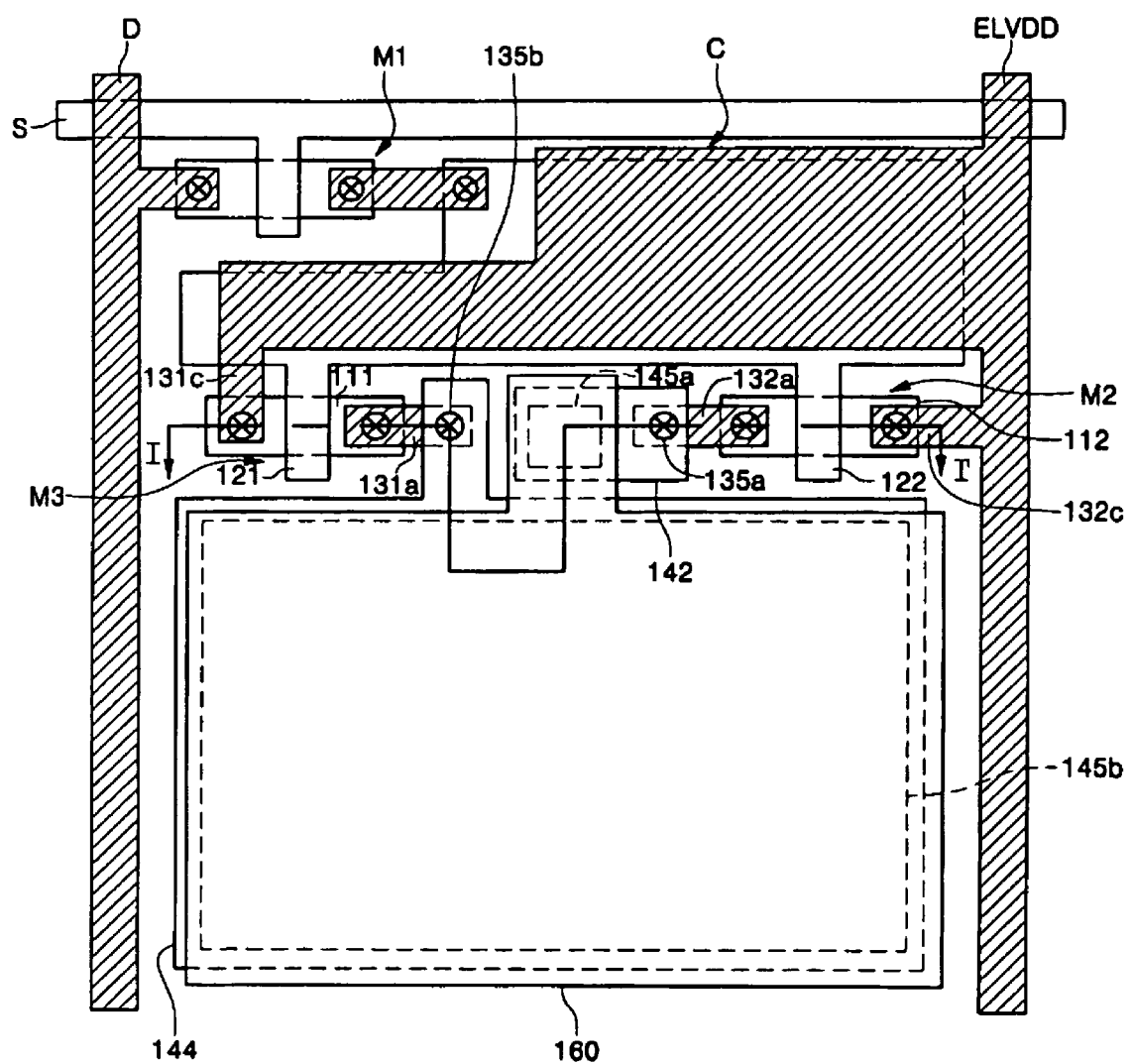
FIG. 5 is a layout of a unit pixel of an organic light emitting display device in accordance with an embodiment of the present invention.
Figure 6A:
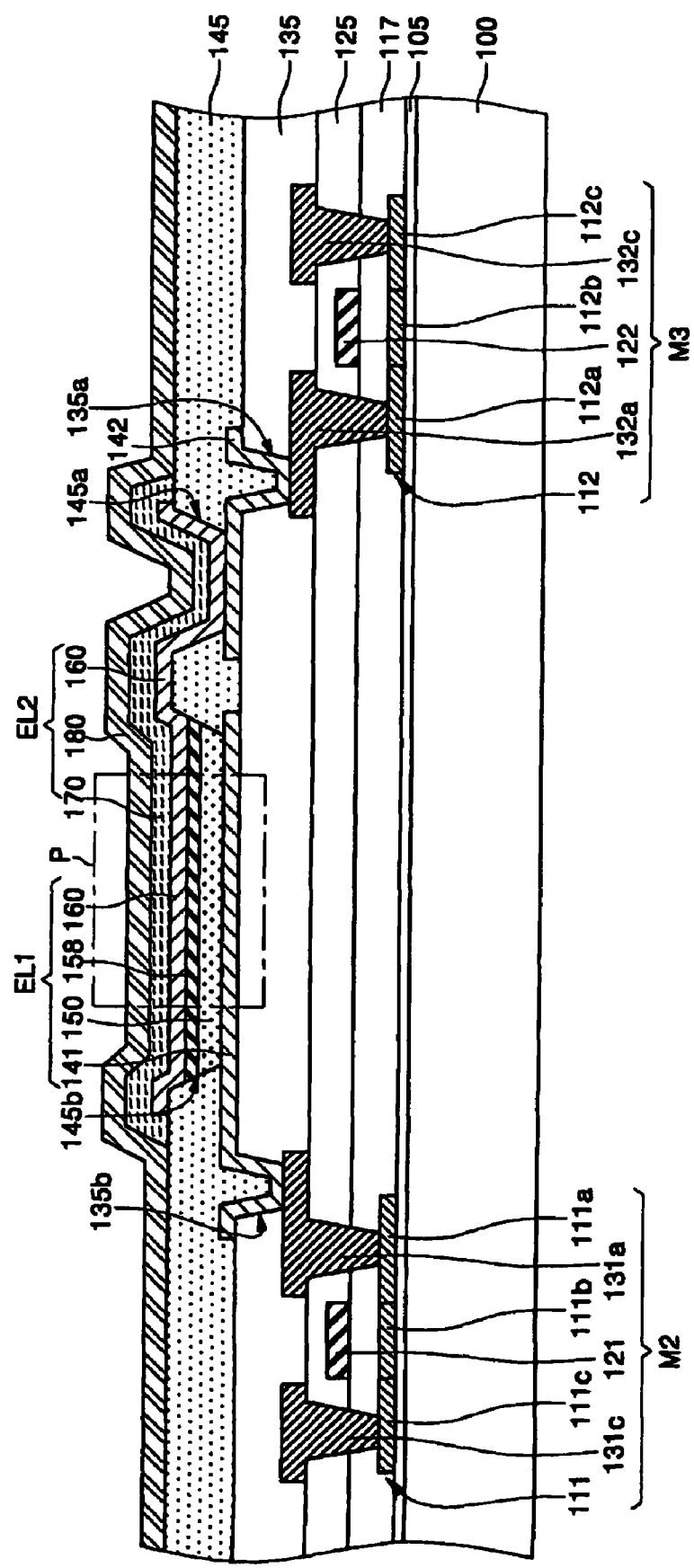
FIG. 6A is a cross-sectional view illustrating an organic light emitting display device taken along the line I-I' of FIG. 5 and a method of fabricating the same in accordance with an embodiment of the present invention.
Figure 6B:
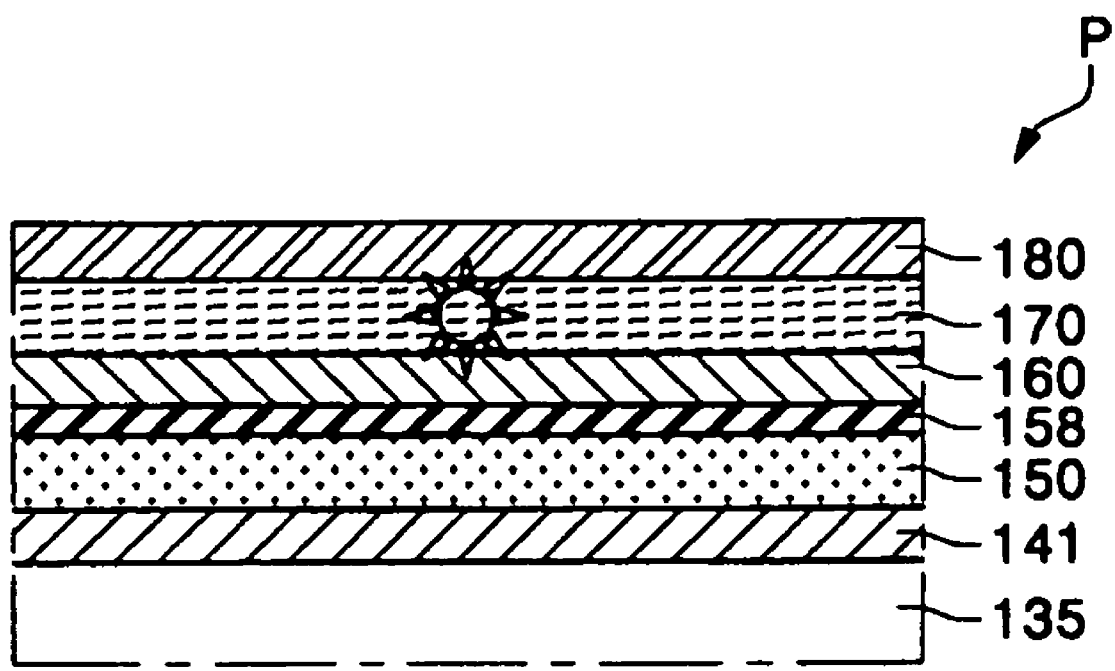
FIG. 6B is an enlarged cross-sectional view of region P in FIG. 6A.

FIG. 5 is a layout of a unit pixel of an organic light emitting display device in accordance with an embodiment of the present invention. FIG. 6A is a cross-sectional view of an organic light emitting display device taken along the line I-I' of FIG. 5 and a method of fabricating the same in accordance with an embodiment of the present invention. FIG. 6B is an enlarged cross-sectional view of region P in FIG. 6A.

Referring to FIGS. 5 and 6A, a buffer layer 105 is shown formed on a substrate 100. The buffer layer 105 may be a silicon oxide layer, a silicon nitride layer, a silicon oxynitride layer, or a multi-layer thereof. The substrate 100 may be a transparent substrate or an opaque transparent. Furthermore, the substrate 100 may be a glass substrate, a plastic substrate, a quartz substrate, a silicon substrate, or a metal substrate.

A first semiconductor layer 111 and a second semiconductor layer 112 are formed on some regions of the buffer layer 105. The semiconductor layers 111 and 112 may be amorphous silicon layers or polycrystalline silicon layers crystallized with the amorphous silicon layers. Preferably, the semiconductor layers 111 and 112 are polycrystalline silicon layers having high charge mobility. A gate insulating layer 117 is formed on the semiconductor layers 111 and 112. The gate insulating layer 117 may be a silicon oxide layer, a silicon nitride layer, a silicon oxynitride layer, or a multi-layer thereof.

A first gate electrode 121 and a second gate electrode 122 are formed on the gate insulating layer 117, which overlaps with the semiconductor layers 111 and 112, respectively. Subsequently, conductive impurities are injected into the semiconductor layers 111 and 112 using the gate electrodes 121 and 122 as masks to form source regions 111c and 112c and drain regions 111a and 112a. In this case, channel regions 111b and 112b are defined between the respective source regions 111c and 112c and the respective drain regions 111a and 112a.

A first interlayer-insulating layer 125 is formed on the gate electrodes 121 and 122 and the semiconductor layers 111 and 112. Contact holes for exposing the source and drain regions 111c and 112c, and 111a and 112a respectively, are formed within the first interlayer-insulating layer 125. A conductive layer is then deposited on the substrate where the contact holes are already formed and is patterned to form electrodes. This conductive layer thereby forms a first source electrode 131c and a first drain electrode 131a connected to the source and drain regions 111c and 111a of the first semiconductor layer 111, respectively. The conductive layer thereby also forms a second source electrode 132c and a second drain electrode 132a connected to the source and drain regions 112c and 112a of the second semiconductor layer 112, respectively.

The first semiconductor layer 111, the first gate electrode 121, and the first source and drain electrodes 131c and 131a form the first driver thin film transistor M2. In addition, the second semiconductor layer 112, the second gate electrode 122, and the second source and drain electrodes 132c and 132a form the second driver thin film transistor M3. The semiconductor layer of the switching thin film transistor M1 is formed when the semiconductor layers 111 and 112 are formed. The scan line S, the gate electrode of the switching transistor M1, and a bottom electrode of the capacitor C are formed when the gate electrodes 121 and 122 are formed. The data line D, the common power line ELVDD, the source and drain electrodes of the switching transistor M1, and a top electrode of the capacitor C are formed when the source and drain electrodes 131c and 131a, and 132c and 132a are formed.

A second interlayer-insulating layer 135 is formed on the source and drain electrodes 131c and 131a, and 132c and 132a. The second interlayer-insulating layer 135 may be a passivation layer, a planarization layer, or a double-layer in which the planarization layer is stacked on the passivation layer. The passivation layer may be a silicon oxide layer, a silicon nitride layer, or a multi-layer thereof. Preferably, the passivation layer is a silicon nitride layer which effectively blocks gas and moisture in order to protect the thin film transistor below the passivation layer, and contains a large amount of hydrogen to passivate an incomplete bond present at a grain boundary of the polycrystalline silicon layer. The planarization layer is an organic layer capable of reducing a step below the planarization layer, which may be a benzocyclobutene (BCB) layer, a polyimide layer, or a polyacrylic layer.

Via holes 135b and 135a are formed within the second interlayer-insulating layer 135; they expose the drain electrodes 131a and 132a, respectively. Also formed are a first electrode 141 connected to the first drain electrode 131a exposed within the via hole 135b, and a conductive pad 142 connected to the second drain electrode 13a exposed within the via hole 135a.

A pixel defining layer 145 is formed on the conductive pad 142 and the first electrode 141. A contact hole 145a exposing at least a portion of the conductive pad 142, and an opening 145b exposing at least a portion of the first electrode 141 are formed within the pixel defining layer 145. The pixel defining layer 145 may be formed of BCB, acrylic photoresist, phenol-based photoresist, or imide-based photoresist.

A first organic emission layer 150 is formed on the first electrode 141 exposed within the opening 145b. The first organic emission layer 150 may be formed by a vacuum deposition method using a shadow mask, an inkjet printing method, or a laser induced thermal imaging method. Furthermore, a hole injection layer, a hole transport layer, a hole block layer, an electron transport layer, or an electron injection layer may be formed above or below the first organic emission layer 150.

Subsequently, a work function assistant layer 158 is formed on the first organic emission layer 150. A second electrode 160 is formed on the conductive pad 142 exposed within the work function assistant layer 158 and the contact hole 145a. However, it may be omitted to form the work function assistant layer 158.

A second organic emission layer 170 is formed on the second electrode 160. The second organic emission layer 170 may be formed by a vacuum deposition method using a shadow mask, an inkjet printing method, or a laser induced thermal imaging method. Furthermore, a hole injection layer, a hole transport layer, a hole block layer, an electron transport layer, or an electron injection layer may be formed above or below the second organic emission layer 170. A third electrode 180 is formed on the second organic emission layer 170.

The first electrode 141 and the second electrode 160 may be formed of conductive layers in which their work functions are similar to each other. Accordingly, the first electrode 141 and the second electrode 160 may act as electrodes having the same polarity to the first OLED (EL1) and the second OLED (EL2). However, the second electrode 160 should act as an electrode having a polarity different from that of the first electrode 141 with respect to the first OLED (EL1), so that the work function assistant layer 158 is preferably introduced to assist the work function of the second electrode 160.

For example, the first electrode 141 and the second electrode 160 may act as anodes of the first OLED (EL1) and the second OLED (EL2). In this case, the first electrode 141 and the second electrode 160 may be formed of one layer selected from a group consisting of an Indium Tin Oxide (ITO) layer, an Indium Zinc Oxide (IZO) layer, a Tin Oxide (TO) layer, and a Zinc Oxide (ZnO) layer. Furthermore, the work function assistant layer 158 may be formed of a layer having a superior electron injection characteristic. For example, the work function assistant layer 158 may be one layer selected from a group consisting of magnesium (Mg), an Mg alloy, silver (Ag), an Ag alloy, aluminum (Al), an Al alloy, calcium (Ca), a Ca alloy, Barium (Ba), and a Ba alloy. The Mg alloy layer may be an MgAg layer.

The first electrode 141, the first organic emission layer 150, and the second electrode 160 form the first OLED (EL1). The second electrode 160, the second organic emission layer 170, and the third electrode 180 form the second OLED (EL2).

As described with reference to FIG. 3, a current proportional to the magnitude of the data signal is supplied by the first driver thin film transistor M2 to the first OLED (EL1), or more specifically, to the first electrode 141. A current proportional to the magnitude of the data signal is also supplied by the second driver thin film transistor M3 to the second OLED (EL2), or more specifically, to the second electrode 160. A reference voltage is applied to the third electrode 180. Accordingly, a voltage difference applied to both ends of the first OLED (EL1) is not significant when the characteristics of the first driver thin film transistor M2 are similar to those of the second driver thin film transistor M3. As a result, the first OLED (EL1) may hardly emit light. On the contrary, the second OLED (EL2) may emit more light because of a voltage difference between the second electrode 160 and the third electrode 180 (see FIG. 6B).

Figure 4:
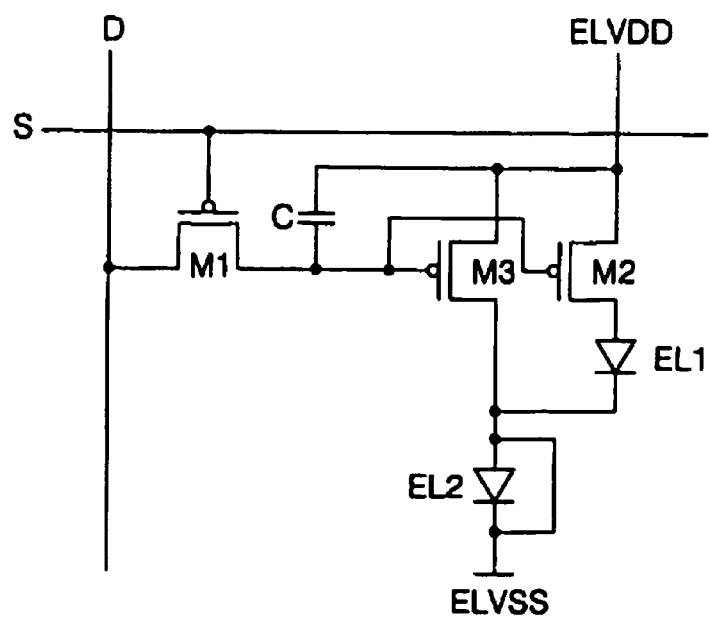
FIG. 4 is a circuit diagram for explaining the operation of a unit pixel when a short failure occurs between both electrodes of the second OLED shown in FIG. 3.
Figure 7A:
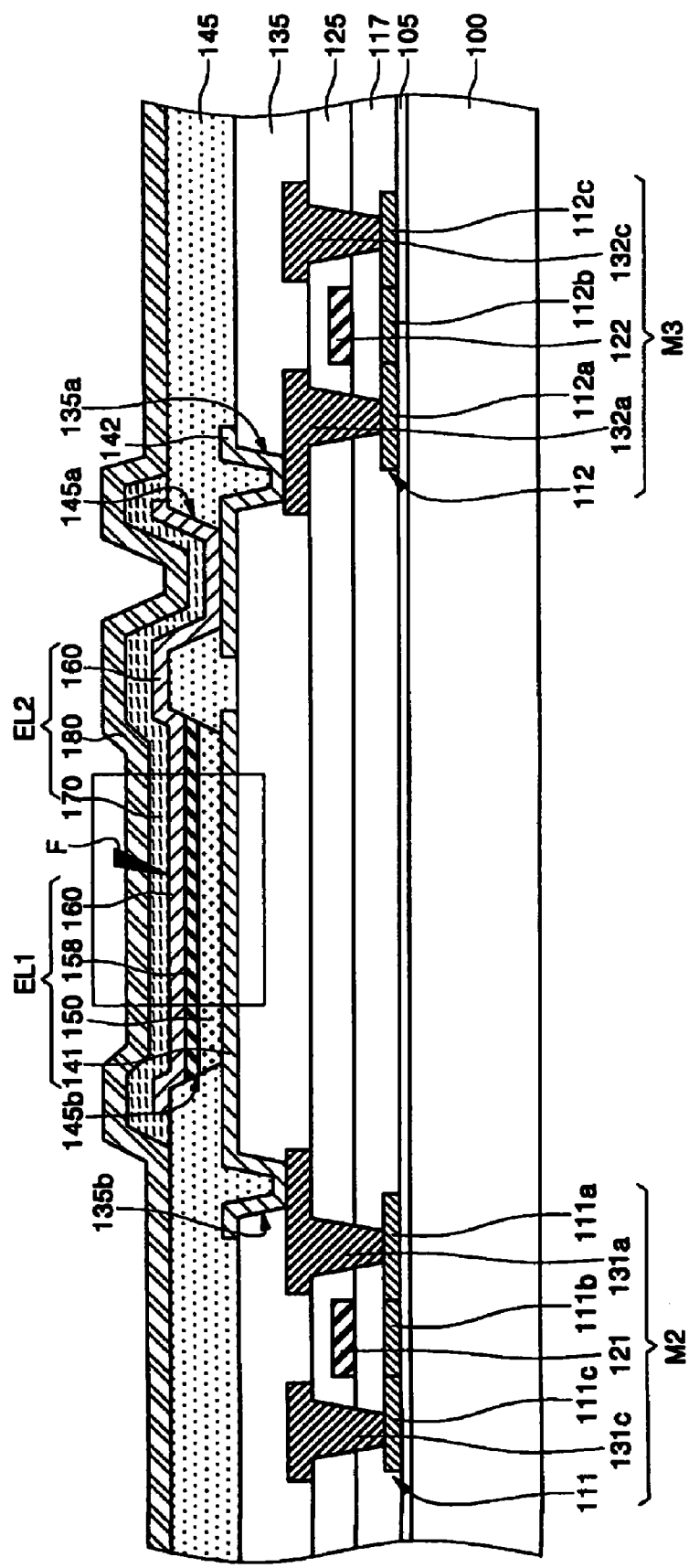
FIG. 7A is a cross-sectional view illustrating a short failure between the second and third electrodes shown in FIG. 6A.
Figure 7B:
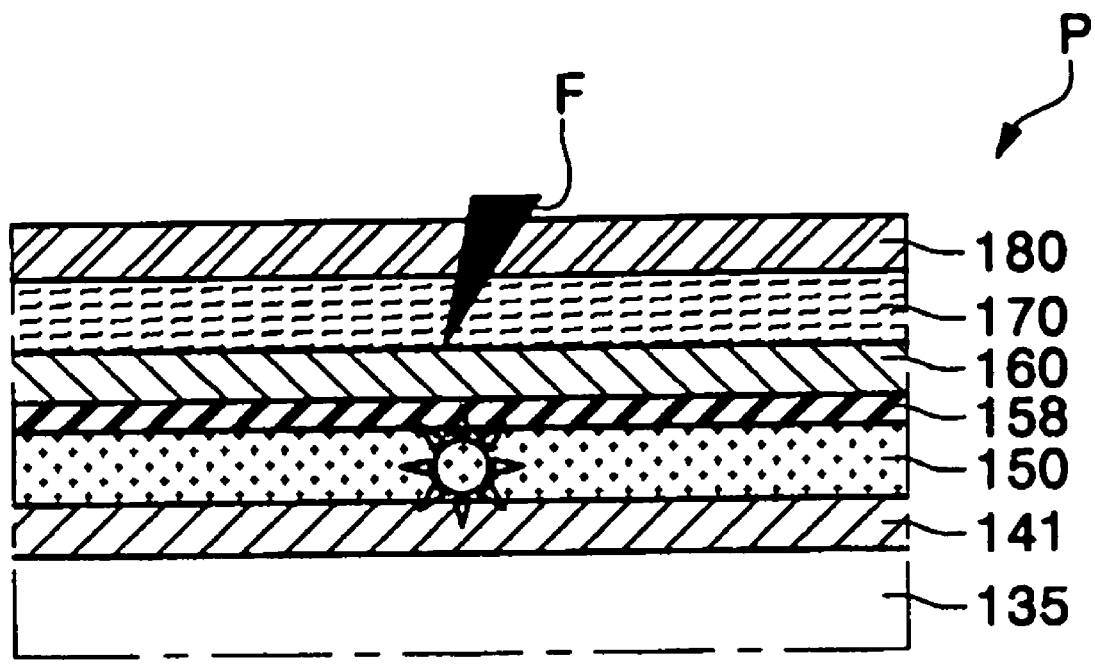
FIG. 7B is an enlarged cross-sectional view of region P in FIG. 7A.

FIG. 4 is a circuit diagram for explaining the operation of a unit pixel when a short failure occurs between both electrodes of the second OLED shown in FIG. 3. FIG. 7A is a cross-sectional view illustrating a short failure between the second and third electrodes shown in FIG. 6A, and FIG. 7B is an enlarged cross-sectional view of region P in FIG. 7A. According to an embodiment of the present invention, the operation of the unit pixel of the organic light emitting display device will be described with reference to FIGS. 4, 7A, and 7B in the case of a short failure occuring between the third electrode 180 and the second electrode 170 due to errors in a process.

Referring to FIGS. 3 and 7A, a current proportional to the magnitude of the data signal is supplied by the first driver thin film transistor M2 to the first OLED (EL1), or more specifically, to the first electrode 141. A current proportional to the magnitude of the data signal is also supplied by the second driver thin film transistor M3 to the second OLED (EL2), or more specifically, to the second electrode 160. In this case, a reference voltage is applied to the third electrode 180. However, a short failure is shown occuring between the second electrode 160 and the third electrode 180 due to errors in a process, for example, due to foreign substances (F), so that a reference voltage is applied to the second electrode 160. Accordingly, the second OLED (EL2) does not emit light.

A reference voltage is applied to the second electrode 160 so that an effective voltage difference occurs between the first electrode 141 and the second electrode 160. This allows the first OLED (EL1) to emit light (see FIG. 7B).

According to the embodiment of the present invention, while the organic light emitting display device allows the second OLED (EL2) to emit light when there is no short failure between the second electrode 160 and the third electrode 180, it allows the first OLED (EL1) to emit light when there is a short failure between the second electrode 160 and the third electrode 180. Furthermore, the first OLED (EL1)

and the second OLED (EL2) are sequentially stacked on the substrate 100; i.e., the first electrode 141, the first organic emission layer 150, the second electrode 160, the second organic emission layer 170, and the third electrode 180 are stacked upon one another respectively. The sequential stacking of the first OLED (EL1) and the second OLED (EL2) will reduce the area of the unit pixel compared to when the two OLEDs are horizontally positioned adjacent to one other.

In one embodiment, the unit pixel may emit light in a normal way even when the short failure occurs between electrodes due to errors in the process. Consequently, pixel defects such as dark pixels may be remarkably reduced so that the yield may be enhanced.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. An organic light emitting display device comprising:
   at least one unit pixel, wherein each unit pixel comprises:
      a first organic light emitting diode having a first electrode, a second electrode, and
      a first organic emission layer positioned between the first and second electrodes;
      a second organic light emitting diode having the second electrode, a third electrode, and a second organic emission layer positioned between the second and third electrodes;
      a first driver thin film transistor connected to the first electrode;
      a second driver thin film transistor connected to the second electrode; and
      a source of the first driver thin film transistor and a source of the second driver thin film transistor are connected to a common power line ELVDD.

2. The organic light emitting display device according to claim 1, further comprising a work function assistant layer positioned between the second electrode and the first organic emission layer.

3. The organic light emitting display device according to claim 1, wherein the first electrode is one layer selected from a group consisting of an Indium Tin Oxide (ITO) layer, an Indium Zinc Oxide (IZO) layer, a Tin Oxide (TO) layer, and a Zinc Oxide (ZnO) layer.

4. The organic light emitting display device according to claim 1, wherein the second electrode is one layer selected from a group consisting of an Indium Tin Oxide (ITO) layer, an Indium Zinc Oxide (IZO) layer, a Tin Oxide (TO) layer, and a Zinc Oxide (ZnO) layer.

5. The organic light emitting display device according to claim 4, further comprising a work function assistant layer interposed between the second electrode and the first organic emission layer, wherein the work function assistant layer is one layer selected from a group consisting of magnesium (Mg), an Mg alloy, silver (Ag), an Ag alloy, aluminum (Al), an Al alloy, calcium (Ca), a Ca alloy, Barium (Ba), and a Ba alloy.

6. The organic light emitting display device according to claim 1, wherein the first electrode, the first organic emission layer, the second electrode, the second organic emission layer, and the third electrode are sequentially stacked on a substrate.

7. The organic light emitting display device according to claim 1, wherein a gate electrode of the first driver thin film transistor and a gate electrode of the second driver thin film transistor are connected to each other, and a source electrode of the first driver thin film transistor and a source electrode of the second driver thin film transistor are connected to each other.

8. An organic light emitting display device comprising:
   at least one unit pixel, wherein each unit pixel comprises:
      a first electrode layer;
      a first organic emission layer formed on the first electrode layer;
      a second electrode layer formed on the first organic emission layer, wherein the first organic emission layer is interposed between the first and second electrodes;
      a second organic emission layer formed on the second electrode layer;
      a third electrode formed on the second organic emission layer, wherein the second organic emission layer is interposed between the second and third electrodes;
      a first driver thin film transistors electrically connected to the first electrode layer;
      a second driver thin film transistor electrically connected to the second electrode layer; and
      a source of the first driver thin film transistor and a source of the second driver thin film transistor are connected to a common power line ELVDD.

9. The organic light emitting display device of claim 8, further comprising:
   a work function assist layer formed between the first organic emission layer and the second electrode layer.

10. An organic light emitting display device comprising:
    a first organic light emitting diode;
    a second organic light emitting diode stacked on the first organic light emitting diode;
    an electrode shared by the first and second organic light emitting diodes;
    a first driver thin film transistors electrically connected to the first organic light emitting diode;
    a second driver thin film transistor electrically connected to the shared electrode; and
    a source of the first driver thin film transistor and a source of the second driver thin film transistor are connected to a common power line ELVDD.

11. The organic light emitting display device of claim 10, wherein the organic light emitting diodes comprise a common electrode.

* * * * *